US012787342B2

(12) United States Patent
Tseng et al.

(10) Patent No.: US 12,787,342 B2
(45) Date of Patent: Nov. 3, 2026

(54) HIGH ELECTRON MOBILITY TRANSISTOR

(71) Applicant: Taiwan-Asia Semiconductor Corporation, Hsinchu City (TW)

(72) Inventors: Yen-Chun Tseng, Hsinchu City (TW); Tzu-Wen Wang, Hsinchu City (TW); Chuan-Wei Chen, Hsinchu City (TW)

(73) Assignee: TAIWAN-ASIA SEMICONDUCTOR CORPORATION, Hsinchu City (TW)

( * ) Notice: Subject to any disclaimer, the term of this patent is extended or adjusted under 35 U.S.C. 154(b) by 447 days.

(21) Appl. No.: 18/500,844

(22) Filed: Nov. 2, 2023

(65) Prior Publication Data

US 2024/0194774 A1 Jun. 13, 2024

(30) Foreign Application Priority Data

Dec. 8, 2022 (TW) ................................. 111147073

(51) Int. Cl.

*H10D 30/47* (2025.01)
*H10D 62/80* (2025.01)
*H10D 62/82* (2025.01)
*H10D 62/85* (2025.01)

(52) U.S. Cl.

CPC ........... *H10D 30/475* (2025.01); *H10D 62/80* (2025.01); *H10D 62/82* (2025.01); *H10D 62/8503* (2025.01)

(58) Field of Classification Search

CPC ...... H10D 30/475; H10D 62/80; H10D 62/82; H10D 62/8503; H10D 30/47; H10D 62/235; H10D 64/251; H10D 30/4732

See application file for complete search history.

(56) References Cited

U.S. PATENT DOCUMENTS 9,443,938 B2 * 9/2016 Mishra ................. H10D 62/405
10,658,471 B2 * 5/2020 Dasgupta ............... H10D 62/82
10,840,348 B2 * 11/2020 Shrivastava ......... H10D 64/671
2019/0035901 A1 1/2019 Cheng et al.
2023/0112883 A1 * 4/2023 Seol ..................... H10D 48/362 257/29

FOREIGN PATENT DOCUMENTS

CN 113035783 A 6/2021
CN 113594037 A 11/2021
TW 202005081 A 1/2020
TW 202010125 A 3/2020

* cited by examiner

*Primary Examiner* — Karen Kusumakar

(74) *Attorney, Agent, or Firm* — MUNCY, GEISSLER, OLDS & LOWE, P.C.

(57) ABSTRACT

The present invention provides a high electron mobility transistor, which includes a substrate, a buffer layer, a gallium nitride layer, a two-dimensional material structure, a covering layer, a drain, a source and a gate. The buffer layer is located on the substrate. The gallium nitride layer is located on the buffer layer and forms a channel layer. The two-dimensional material structure is located on the channel layer. The covering layer partially covers the two-dimensional material structure. The drain and the source are arranged on the two-dimensional material structure, and the gate is arranged on the covering layer.

11 Claims, 4 Drawing Sheets

1a

HIGH ELECTRON MOBILITY TRANSISTOR

CROSS-REFERENCES TO RELATED APPLICATIONS

This application claims the benefit of priority to Taiwanese Patent Application No. 111147073 filed on Dec. 8, 2022, which is hereby incorporated by reference in its entirety.

BACKGROUND OF THE INVENTION

Field of the Invention

The present invention relates to a transistor, in particular to a high electron mobility transistor.

Descriptions of the Related Art

A high electron mobility transistor (HEMT) is a field effect transistor that uses semiconductor materials with different energy gaps to form a two-dimensional electron gas (2DEG) layer at the junction. Due to the high electron mobility of the two-dimensional electron gas, HEMTs can provide advantages such as high breakdown voltage, low resistance and high electron mobility and are widely used in high-power electronic devices.

Depending on different designs and functions, HEMTs can be sorted into the enhancement-mode (E-mode) HEMT and the depletion-mode (D-mode) HEMT. In the case of the depleted AlGaN/GaN HEMT, undoped GaN serving as a channel layer grows on carbon-doped (C-doped) GaN, and then AlGaN grows on the channel layer to form a covering layer. By means of the polarization effect of AlGaN and GaN, a two-dimensional electron gas layer can be formed in the channel layer. However, the GaN material used in conventional designs still has limitations in electron mobility, which affects the electrical characteristics of HEMT devices.

Therefore, how to design a high electron mobility transistor that can improve electron mobility is indeed a topic worthy of research.

SUMMARY OF THE INVENTION

One of the objectives of the present invention is to provide a high electron mobility transistor using a two-dimensional material structure.

To achieve the above objective, the present invention provides a high electron mobility transistor, which includes a substrate, a buffer layer, a gallium nitride layer, a two-dimensional material structure, a covering layer, a drain, a source and a gate. The buffer layer is located on the substrate. The gallium nitride layer is located on the buffer layer and forms a channel layer. The two-dimensional material structure is located on the channel layer. The covering layer partially covers the two-dimensional material structure. The drain and the source are arranged on the two-dimensional material structure, and the gate is arranged on the covering layer.

In one embodiment of the present invention, the two-dimensional material structure includes two connection parts and an extension part, each connection part is connected to the extension part, and each connection part has a thickness greater than that of the extension part.

In one embodiment of the present invention, the extension part is made of at least one two-dimensional material layer.

In one embodiment of the present invention, wherein each connection part is made by stacking a plurality of two-dimensional material layers, and a number of the plurality of two-dimensional material layers is greater than 5.

In one embodiment of the present invention, the plurality of two-dimensional material layers are a bulk structure.

In one embodiment of the present invention, any one of the plurality of two-dimensional material layers has a size not smaller than that of an adjacent two-dimensional material layer stacked thereon.

In one embodiment of the present invention, the drain and the source are respectively located on the two connection parts to form an ohmic contact.

In one embodiment of the present invention, the transistor further includes a gradient structure formed at a junction between each connection part and the extension part, wherein a thickness of the gradient structure gradually decreases from the respective connection part toward the extension part.

In one embodiment of the present invention, the covering layer covers only the extension part of the two-dimensional material structure, and a top surface of the covering layer is flush with a top surface of each connection part.

In one embodiment of the present invention, the covering layer covers only the extension part of the two-dimensional material structure, and a top surface of the covering layer is not flush with a top surface of each connection part.

In one embodiment of the present invention, the two-dimensional material structure is made of a material selected from a group consisting of $MoS_2$, $WS_2$, α-P, Sb, $TiCO_2$, $Hf_2CO_2$, $Zr_2CO_2$, BCN, $B_2Se_2$, BCP, BP, and BAs.

In one embodiment of the present invention, the covering layer is made of aluminum gallium nitride.

Accordingly, the high electron mobility transistor of the present invention can effectively improve the electron mobility of the channel layer by the characteristics of the two-dimensional material and improve the device characteristics of the high electron mobility transistor accordingly. Moreover, the effect of turning on or off the control device can be achieved by adjusting the reverse bias applied to the gate.

DETAILED DESCRIPTION OF THE PREFERRED EMBODIMENT

Since various aspects and embodiments are only illustrative and non-restrictive, those skilled in the art may conceive other aspects and embodiments without departing from the scope of the present invention. The features and advantages of these embodiments will become apparent from the following detailed description and the claims appended hereto.

In this disclosure, the term "one", "a" or "an" is used to describe the elements and components described herein. This is done for convenience of explanation only and to provide a general sense of the scope of the invention. Accordingly, unless otherwise indicated, such description should be understood to encompass one or at least one, and the singular should also include the plural.

In this disclosure, the terms “first”, “second” and other similar ordinal numbers are mainly used to distinguish or refer to the same or similar elements or structures, and do not necessarily imply that these elements or structures are located in space or time sequence. It should be understood that in certain situations or configurations, ordinal words can be used interchangeably without affecting the implementation of the invention.

In this disclosure, the terms “includes,” “has,” and any other similar terms are intended to cover non-exclusive inclusions. For example, an element or structure containing plural elements is not limited to the elements listed herein, but may include other elements not expressly listed but that are generally inherent to the element or structure.

Figure 1:
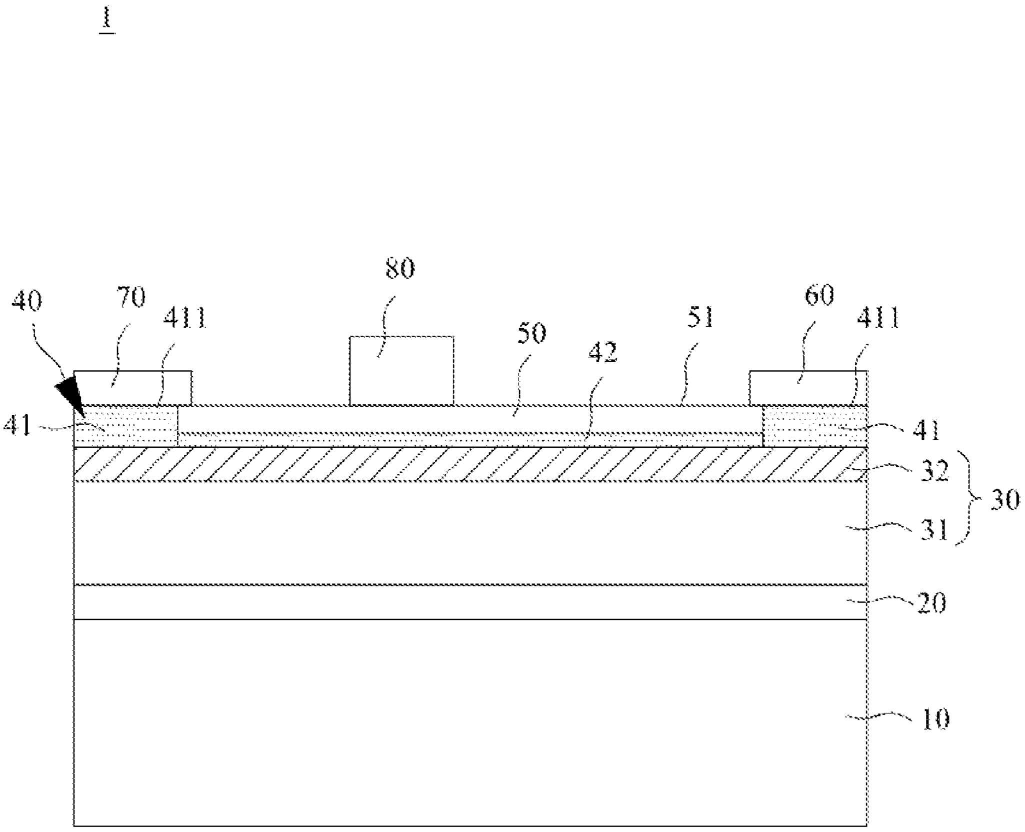
FIG. 1 is a schematic diagram of a first embodiment of the high electron mobility transistor of the present invention.
Figure 2:
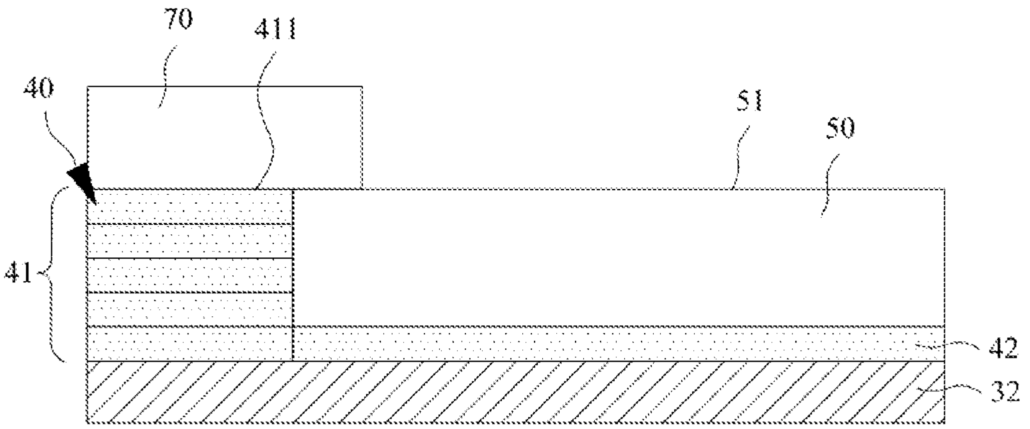
FIG. 2 is a schematic diagram partially showing the first embodiment of the high electron mobility transistor of the present invention.

Reference is made to FIG. 1 and FIG. 2. FIG. 1 is a schematic diagram of the first embodiment of the high electron mobility transistor of the present invention, and FIG. 2 is a schematic diagram partially showing the first embodiment of the high electron mobility transistor of the present invention. As shown in FIG. 1, the high electron mobility transistor 1 of the present invention includes a substrate 10, a buffer layer 20, a gallium nitride layer 30, a two-dimensional material structure 40, a covering layer 50, a drain 60, a source 70 and a gate 80. The substrate 10 serves as the foundational component of the high electron mobility transistor 1. The substrate 10 may be made of silicon (Si), silicon carbide (SiC) or sapphire, and it may also be made of other semiconductor materials.

The buffer layer 20 is located on the substrate 10. The buffer layer 20 serves to alleviate the stress on the surface of the substrate 10 for facilitating the formation of other semiconductor materials on the substrate 10. The buffer layer 20 can be made of materials such as aluminum nitride (AlN), aluminum gallium nitride (AlGaN), or other composite materials in the form of a superlattice structure.

The gallium nitride layer 30 is located on the buffer layer 20. In one embodiment of the present invention, the gallium nitride layer 30 may include a carbon-doped (C-doped) gallium nitride layer 31 (or a Fe-doped gallium nitride layer) near the buffer layer 20, as well as an undoped gallium nitride layer stacked on the top of the carbon-doped gallium nitride layer 31 away from the buffer layer 20 for forming a channel layer 32. The channel layer 32 can serve as the channel for the two-dimensional electron gas (2DEG).

The two-dimensional material structure 40 is located on the channel layer 32 of the gallium nitride layer 30. The two-dimensional material structure 40 is primarily made of a few-layer two-dimensional material (FL-2D material). The material of the two-dimensional material structure 40 is selected from a group consisting of $MoS_2$, $WS_2$, α-P, Sb, $TiCO_2$, $Hf_2CO_2$, $Zr_2CO_2$, BCN, $B_2Se_2$, BCP, BP, and BAs. According to the disclosure of the reference “Recent Advances in the Carrier Mobility of Two-Dimensional Materials: A Theoretical Perspective, ACS Omega 2020 5 (24), 14203-14211”, the relevant data about the band gap (eV) and electron/hole mobility (103 $cm^2/V*s$) of the aforementioned two-dimensional materials are shown in Table 1, where μ represents mobility, superscripts e and h represent electrons and holes respectively, and subscripts x and y represent the X-axis and Y-axis respectively. It can be seen that two-dimensional materials can provide superior electron and hole mobility.

TABLE 1

| Material | Band gap | $\mu_x^e$ | $\mu_x^h$ | $\mu_y^e$ | $\mu_y^h$ |
|---|---|---|---|---|---|
| $MoS_2$ | 1.8 | 0.072 | 0.060 | 0.200 | 0.152 |
| $WS_2$ | 1.54 | 0.12 | 0.21 | — | — |
| a-P | 1.0 | 1.14 | 0.08 | 0.70 | 26 |
| Sb | 1.8 | 0.045 | 0.034 | 0.015 | 0.016 |
| $TiCO_2$ | 0.91 | 0.611 | 0.254 | 74.1 | 22.5 |
| $Hf_2CO_2$ | 1.79 | 0.126 | 2.270 | 2.192 | 1.598 |
| $Zr_2CO_2$ | 1.76 | 0.083 | 1.096 | 2.299 | 1.695 |
| BCN | 1.97 | 0.176 | 0.088 | 0.023 | 0.164 |
| $B_2Se_2$ | 4.94 | 615 | 11.1 | 623 | 11.4 |
| BCP | 0.55 | 1.59 | 1.61 | 2.29 | 0.84 |
| BP | 0.91 | 49.96 | 13.70 | 68.81 | 26.05 |
| BAS | 0.46 | 39.28 | 16.92 | 57.28 | 32.46 |

As shown in FIG. 1 and FIG. 2, the two-dimensional material structure 40 of the present invention includes two connection parts 41 and an extension part 42. Each connection part 41 is mainly provided for arrangement of the corresponding electrodes, while the extension part 42 serves as the electron transport channel. The two connection part 41 are connected to the extension part 42, and the thickness of each connection part 41 is greater than that of the extension part 42. The extension part 42 is made of at least one two-dimensional material layer. For example, in this embodiment, only a single two-dimensional material layer is used as the extension part 42. The two-dimensional material layer herein is defined as a single atomic layer formed by the two-dimensional material. Each connection part 41 is made by stacking a plurality of two-dimensional material layers, and the number of the plurality of two-dimensional material layers is greater than 5. Preferably, the number of the plurality of two-dimensional material layers may be up to 10, or even more than 10. In addition, the size (such as area) of any one of the two-dimensional material layers should not be smaller than that of an adjacent two-dimensional material layer stacked thereon. For example, in this embodiment, the sizes (the radial length only shown in FIG. 1 and FIG. 2) of each of the plurality of two-dimensional material layers of each connection part 41 are the same. Thus, each connection part 41 is formed as, but not limited to, a bulk structure by stacking the plurality of two-dimensional material layers.

The covering layer 50 partially covers the two-dimensional material structure 40. Furthermore, the covering layer 50 mainly covers the extension part 42 of the two-dimensional material structure 40 but fails to cover the connection parts 41 of the two-dimensional material structure 40. In the present invention, the covering layer 50 is made of aluminum gallium nitride. The position of the top surface 51 of the covering layer 50 with respect to the top surface 411 of each connection part 41 varies depending on the thickness of each connection part 41 of the two-dimensional material structure 40. In this embodiment, the top surface 51 of the covering layer 50 is flush with the top surface 411 of each connection part 41. However, the present invention is not limited hereto. The top surface 51 of the covering layer 50 may be higher or lower than the top surface 411 of each connection part 41.

The drain 60 and the source 70 are disposed on the two-dimensional material structure 40. Specifically, the drain 60 is disposed on one of the connection parts 41 of the two-dimensional material structure 40 for forming an ohmic contact between the drain 60 and that connection part 41. The source 70 is disposed on the other connection part 41 for forming an ohmic contact between the source 70 and the other connection part 41. The gate 80 is disposed on the top surface 51 of the covering layer 50 for forming either an ohmic contact or a Schottky contact between the gate 80 and the covering layer 50.

Due to the high electron mobility characteristics of the FL-2D material, in the high electron mobility transistor 1 of the present invention, an electron channel with high electron mobility can be formed by the two-dimensional material structure 40 and the channel layer 32. In the following description, the two-dimensional material structure 40 is made of $MoS_2$, but the present invention is not limited hereto. Moreover, according to the disclosure of the reference "Dirac Cones in Graphene, Interlayer Interaction in Layered Materials, and the Band Gap in $MoS_2$, Crystals 2016, 6, 143", it can be known that if a single two-dimensional material layer is formed of $MoS_2$, band gap thereof is approximately 1.84 eV. If a stack structure (or a bulk structure) of the plurality of two-dimensional material layers is formed of $MoS_2$, the band gap thereof is merely about 0.76 eV. In other words, in this case, the aforementioned stack structure exhibits approximate metallic behavior. Therefore, in the present invention, when the source 70 and the drain 60 are respectively disposed on the two connection part 41 of the two-dimensional material structure 40, it is easy to form an ohmic contact between the buck-like structure formed by $MoS_2$ and the metal electrode. The extension part 42 of the two-dimensional material structure 40 is made of a single layer or a few-layer of $MoS_2$ material to maintain the characteristics of high electron mobility.

Due to the high electron mobility characteristics of the aforementioned few-layer 2D materials, in the high electron mobility transistor 1 of the present invention, an electron channel with high electron mobility can be formed by the two-dimensional material structure 40 and the channel layer 32. When electrons are transferred through the two-dimensional material between the source 70 and the drain 60, the high electron mobility transistor 1 of the present invention exhibits superior electron characteristics.

Additionally, the high electron mobility transistor 1 of the present invention forms an epitaxial structure of a depletion-mode HEMT. By means of the polarization effect between the channel layer 32 and the covering layer 50, a two-dimensional electron gas (2DEG) is formed within the channel layer 32 and the two-dimensional material structure 40, and remains in a normal ON state. At this state, the gate 80 can serve as the switch of the high electron mobility transistor 1 of the present invention. By applying a bias to the gate 80, the energy band of AlGaN/GaN can be correspondingly adjusted, thereby increasing or decreasing the concentration of the two-dimensional electron gas. For example, in the case that no voltage is applied to the gate 80, the high electron mobility transistor 1 of the present invention is in the ON state; whereas in the case that a reverse bias is applied to the gate 80, the high electron mobility transistor 1 of the present invention switches to the OFF state.

Figure 3:
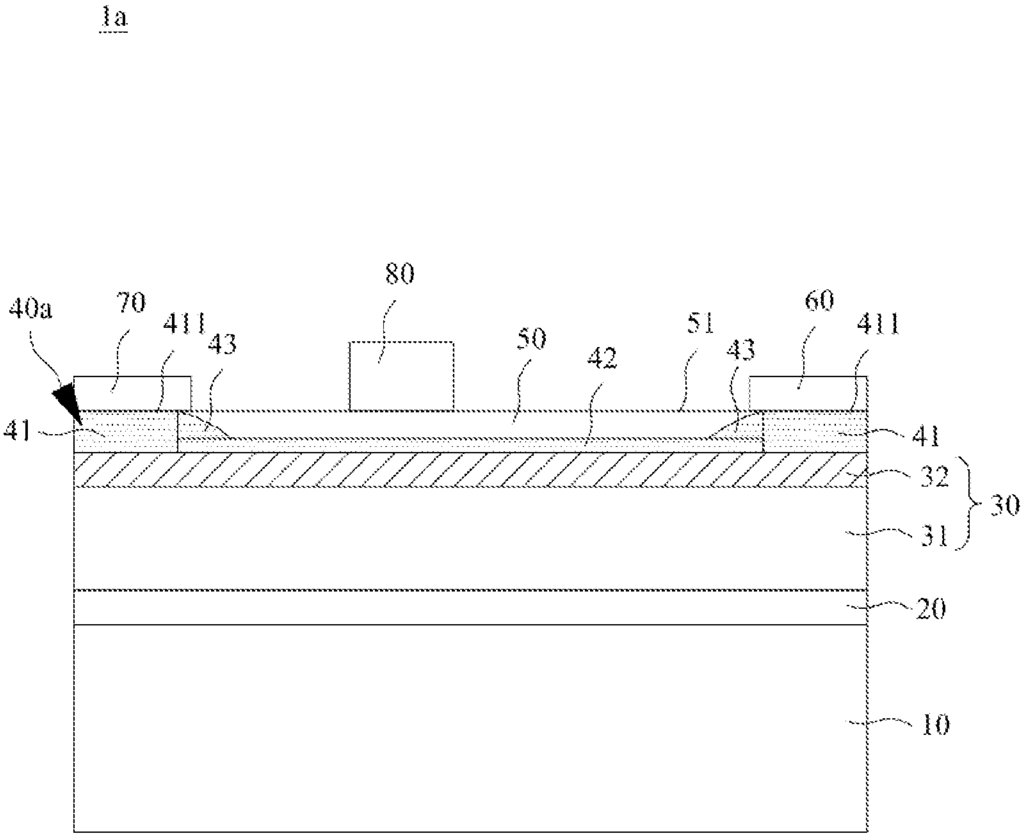
FIG. 3 is a schematic diagram of a second embodiment of the high electron mobility transistor of the present invention.
Figure 4:
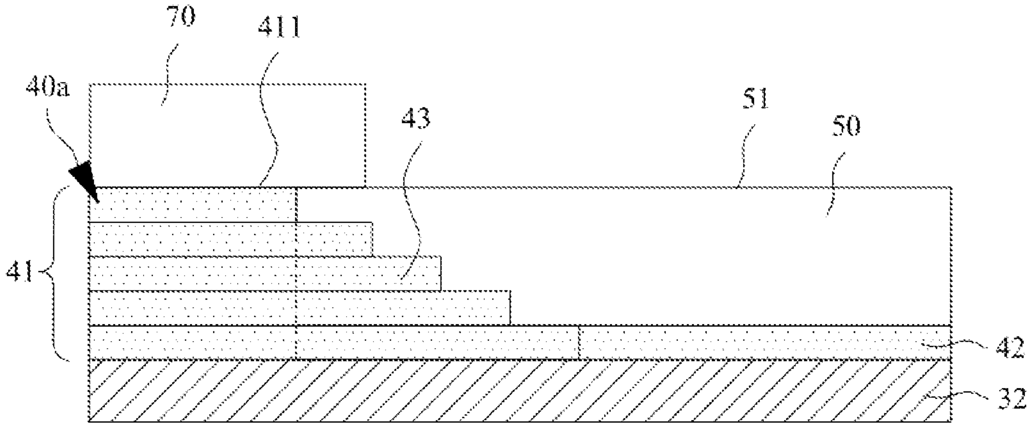
FIG. 4 is a schematic diagram partially showing the second embodiment of the high electron mobility transistor of the present invention.

Reference is made to FIG. 3 and FIG. 4. FIG. 3 is a schematic diagram of a second embodiment of the high electron mobility transistor of the present invention, and FIG. 4 is a schematic diagram of a local structure of the second embodiment of the high electron mobility transistor of the present invention. This embodiment is a modification of the first embodiment, and the structural design of the two-dimensional material structure is changed mainly. As shown in FIG. 3 and FIG. 4, in this embodiment, the two-dimensional material structure 40*a* of the high electron mobility transistor 1*a* of the present invention includes two connection parts 41 and an extension part 42, and a gradient structure 43 is formed at the junction between each connection part 41 and the extension part 42. The thickness of the gradient structure 43 gradually decreases from the respective connection part 41 toward the extension part 42 to form a relatively gentle slope. For example, in this embodiment, the size of any one of the plurality of two-dimensional material layers in the previous embodiment (the radial length only shown in FIG. 3 and FIG. 4) is greater than that of an adjacent two-dimensional material layer stacked thereon. In other words, the size of each two-dimensional material layer in the plurality of two-dimensional material layers of each connection part 41 gradually decreases from the bottom to the top. Thus, a buck structure is formed for one part and a step-like structure, constituting the aforementioned gradient structure 43, is formed for another part after each connection part 41 is formed by stacking the plurality of two-dimensional material layers.

Additionally, in this embodiment, the top surface 51 of the covering layer 50 is higher than the top surface 411 of each connection part 41. In another word, the top surface 51 of the covering layer 50 is not flush with the top surface 411 of each connection part 41.

The above embodiments are provided for illustrative purposes and are not intended to limit the embodiments or their applications or uses. Additionally, although at least one exemplary embodiment has been presented in the above embodiments, it should be understood that various variations or modifications can be made for the present invention. It should also be understood that the embodiments described herein are not intended to limit the scope, application, or configuration of the claimed subject matter in any way. On the contrary, the embodiments described above can provide a convenient guide for those skilled in the art to implement one or more embodiments. Furthermore, various changes can be made to the functionality and arrangement of the components without departing from the scope defined by the claims, and the claims encompass known equivalents and foreseeable equivalents at the time of filing of this patent application.

What is claimed is:

1. A high electron mobility transistor, including:
- a substrate, a buffer layer, located on the substrate;
- a gallium nitride layer, located on the buffer layer and forming a channel layer;
- a two-dimensional material structure, located on the channel layer;
- a covering layer, partially covering the two-dimensional material structure;
- a drain and a source, arranged on the two-dimensional material structure; and
- a gate, arranged on the covering layer;
- wherein the two-dimensional material structure includes two connection parts and an extension part, each connection part is connected to the extension part, and each connection parts has a thickness greater than that of the extension part.

2. The high electron mobility transistor of claim 1, wherein the extension part is made of at least one two-dimensional material layer.

3. The high electron mobility transistor of claim 1, wherein each of the connection parts is made by stacking a plurality of two-dimensional material layers, and a number of the plurality of two-dimensional material layers is greater than 5.

4. The high electron mobility transistor of claim 3, wherein the plurality of two-dimensional material layers are a bulk structure.

5. The high electron mobility transistor of claim 3, wherein any one of the multiple two-dimensional material layers has a size not smaller than that of an adjacent two-dimensional material layer stacked thereon.

6. The high electron mobility transistor of claim 1, wherein the drain and the source are respectively located on the two connection parts to form an ohmic contact.

7. The high electron mobility transistor of claim 1, further including a gradient structure formed at a junction between each connection part and the extension part, wherein a thickness of the gradient structure gradually decreases from the respective connection part toward the extension part.

8. The high electron mobility transistor of claim 1, wherein the covering layer covers only the extension part of the two-dimensional material structure, and a top surface of the covering layer is flush with a top surface of each connection part.

9. The high electron mobility transistor of claim 1, wherein the covering layer covers only the extension part of the two-dimensional material structure, and a top surface of the covering layer is not flush with a top surface of each connection part.

10. The high electron mobility transistor of claim 1, wherein the two-dimensional material structure is made of a material selected from a group consisting of $MoS_2$, $WS_2$, α-P, Sb, $TiCO_2$, $Hf_2CO_2$, $Zr_2CO_2$, BCN, $B_2Se_2$, BCP, BP, and BAs.

11. The high electron mobility transistor of claim 1, wherein the covering layer is made of aluminum gallium nitride.

* * * * *